United States Patent
Banerji et al.

(10) Patent No.: US 7,621,041 B2
(45) Date of Patent: Nov. 24, 2009

(54) METHODS FOR FORMING MULTILAYER STRUCTURES

(75) Inventors: Sounak Banerji, Cary, NC (US); G. Sidney Cox, Durham, NC (US); Karl Hartmann Dietz, Raleigh, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 400 days.

(21) Appl. No.: 11/451,763

(22) Filed: Jun. 13, 2006

(65) Prior Publication Data
US 2007/0006435 A1   Jan. 11, 2007

Related U.S. Application Data

(60) Provisional application No. 60/698,426, filed on Jul. 11, 2005.

(51) Int. Cl.
*H05K 3/30* (2006.01)

(52) U.S. Cl. .................... 29/832; 29/25.41; 29/842; 29/847; 29/852; 257/296; 257/307; 257/308; 361/311; 361/313; 438/230; 438/244; 438/250; 438/253

(58) Field of Classification Search ............ 29/25.41, 29/592.1, 832, 842, 847, 852; 361/311, 313; 257/296, 307, 308; 438/230, 244, 250, 253
See application file for complete search history.

(56) References Cited

U.S. PATENT DOCUMENTS

| | | | |
|---|---|---|---|
| 3,287,311 A | 11/1966 | Edwards et al. | |
| 5,010,641 A | 4/1991 | Sisler | |
| 5,079,069 A | 1/1992 | Howard et al. | |
| 5,155,655 A | 10/1992 | Howard et al. | |
| 5,161,086 A | 11/1992 | Howard et al. | |
| 5,162,977 A | 11/1992 | Paurus et al. | |
| 5,298,331 A | 3/1994 | Kanakarajan et al. | |
| 5,428,499 A | 6/1995 | Szerlip et al. | |

(Continued)

FOREIGN PATENT DOCUMENTS

EP   0 451 541 A1   3/1991

(Continued)

OTHER PUBLICATIONS

Takuya Yamamoto, John Andresakis and Fjuo Kuwako, Ultra-Thin Substrate and HI-DK RCC For Use As Embedded Capacitors, Oak Mitsui Technologies LLC, Hoosick Falls, New York, USA, TPCA Forum 2004, pp. 52-57.

*Primary Examiner*—Paul D Kim

(57) ABSTRACT

The present invention relates to methods of forming multilayer structures and the structures themselves. In one embodiment, a method of forming a multilayer structure comprises: providing a dielectric composition comprising paraelectric filler and polymer wherein the paraelectric filler has a dielectric constant between 50 and 150; applying the dielectric composition to a carrier film thus forming a multilayer film comprising a dielectric layer and carrier film layer; laminating the multilayer film to a circuitized core wherein the dielectric layer of the multilayer film is facing the circuitized core; and removing the carrier film layer from the dielectric layer prior to processing; applying a metallic layer to the dielectric layer wherein the circuitized core, dielectric layer and metallic layer form a planar capacitor; and processing the planar capacitor to form a multilayer structure.

10 Claims, 2 Drawing Sheets

S - Signal
P - Power
G - Ground

U.S. PATENT DOCUMENTS

| | | | |
|---|---|---|---|
| 5,469,324 | A | 11/1995 | Henderson et al. |
| 5,586,301 | A | 12/1996 | Fisherman et al. |
| 5,870,274 | A | 2/1999 | Lucas |
| 6,183,592 | B1 | 2/2001 | Sylvester |
| 6,284,655 | B1 | 9/2001 | Marsh |
| 6,323,511 | B1 | 11/2001 | Marsh |
| 6,346,743 | B1 | 2/2002 | Figueroa et al. |
| 6,403,414 | B2 | 6/2002 | Marsh |
| 6,407,929 | B1 | 6/2002 | Hale et al. |
| 6,495,458 | B2 | 12/2002 | Marsh |
| 6,600,645 | B1 | 7/2003 | Lauf et al. |
| 6,611,419 | B1 | 8/2003 | Chakravorty |
| 6,819,540 | B2 | 11/2004 | Allen et al. |
| 6,882,045 | B2 * | 4/2005 | Massingill et al. .......... 257/724 |
| 2002/0054471 | A1 | 5/2002 | Adae-Amoakoh et al. |
| 2002/0134581 | A1 | 9/2002 | Figueroa et al. |
| 2004/0233611 | A1 | 11/2004 | Borland |
| 2006/0133011 | A1 * | 6/2006 | Cox ........................... 361/311 |

FOREIGN PATENT DOCUMENTS

| | | |
|---|---|---|
| EP | 1 020 487 A1 | 7/2000 |
| EP | 1 369 399 A1 | 12/2003 |
| EP | 1 553 626 A1 | 7/2005 |
| JP | 57-011407 | 1/1980 |

* cited by examiner

METHODS FOR FORMING MULTILAYER STRUCTURES

RELATED APPLICATIONS

This application is related to and claims priority to the applications U.S. Provisional Application Ser. Nos. 60/638001, 60/637813, 60/637817, and 60/637816, respectively filed in the U.S. Patent and Trademark Office on Dec. 21, 2004.

TECHNICAL FIELD

The technical field relates to dielectric composition(s) and film(s) and their use in electronic circuitry and components, such as a multilayer printed circuit. The multilayer printed circuit can be a rigid, flexible, or rigid-flex circuit board, a multilayered chip package, or a multichip package.

TECHNICAL BACKGROUND

An increasing need exists for reducing the size and increasing the performance of integrated circuit components. One common part of the integrated circuit components, for example planar capacitor components, includes a dielectric layer that is formed from a composition comprising a dielectric functional filler material and a polymer. Typically, using a dielectric functional filler material having a high dielectric constant, K, in a capacitor allows for storage of the same amount of electrical charge for a given thickness of the dielectric layer in a reduced capacitor area versus that containing no filler.

Various types of dielectric layers are currently being used in the processing of circuit board capacitors, however, the dielectric constant of the dielectric layer is limited and problems exist in regard to certain electrical properties, such as low dielectric withstanding voltage and high leakage current. Both of these problems limit the capability of the final capacitor and, in many cases, limit the ability to decrease the thickness of the dielectric layer within the capacitor to the desired level.

FIG. 1 is a cross section view of a portion of a printed circuit board 25 having SMT capacitors 50 connected to an IC device 30 to form a prior art printed circuit board 25. The signal line carrying the signal to the IC 30 is connected to a circuit trace 60 connecting the IC device 30 to the capacitor 50. The capacitors 50 are coupled to a circuit trace 70 by one of a pair of solder pads 52 and solder joints 58 and coupled to the circuit trace 70 by a solder pad 42 and a solder joint 48. The capacitors 50 are coupled to a via hole 80 by the other solder pad 58 and a circuit trace 59. This arrangement places the two capacitors 50 in series with the signal line and connected to ground through a plated through-hole via 80. This conventional surface mount approach requires use of valuable surface real estate. Further, the requirement for solder joints reduces reliability and increases costs of fabrication.

Accordingly, the present inventors desired to provide dielectric compositions and films for use in capacitor formation in electronic components that have desirable electrical and physical properties, such as high dielectric withstanding voltage and low leakage current. These dielectric compositions and films are especially useful when they are placed in close proximity to semiconductor devices (chips, integrated circuits) to deliver the charge to the semiconductor fast, with minimal delay due to loop inductance, to enable fast signal rise time, and to dampen semiconductor switching noise. The present invention provides such compositions, films, devices and methods of making such devices.

SUMMARY OF THE INVENTION

The present invention relates to methods of forming multilayer structures and the structures themselves. In one embodiment, a method of forming a multilayer structure comprising: providing a dielectric composition comprising: paraelectric filler and polymer wherein said paraelectric filler has a dielectric constant between 50 and 150; applying said dielectric composition to a carrier film thus forming a multilayer film comprising a dielectric layer and carrier film layer; laminating said multilayer film to a circuitized core wherein the dielectric layer of said multilayer film is facing said circuitized core; and removing said carrier film layer from said dielectric layer prior to processing; applying a metallic layer to said dielectric layer wherein said circuitized core, dielectric layer and metallic layer form a planar capacitor; and processing said planar capacitor to form a multilayer structure.

A further embodiment relates to a method of forming a multilayer structure comprising: providing a dielectric composition comprising: paraelectric filler and polymer wherein said paraelectric filler has a dielectric constant between 50 and 150; applying said dielectric composition to a metallic carrier film thus forming a multilayer film comprising a dielectric layer and carrier film layer; laminating said multilayer film to a circuitized core wherein the dielectric layer of said multilayer film is facing said circuitized core and wherein said circuitized core, dielectric layer and carrier film layer form a planar capacitor; and processing said planar capacitor to form a multilayer structure.

BRIEF DESCRIPTION OF THE DRAWINGS

The detailed description will refer to the following drawings, wherein like numerals refer to like elements, and wherein.

DETAILED DESCRIPTION

Figure 1:
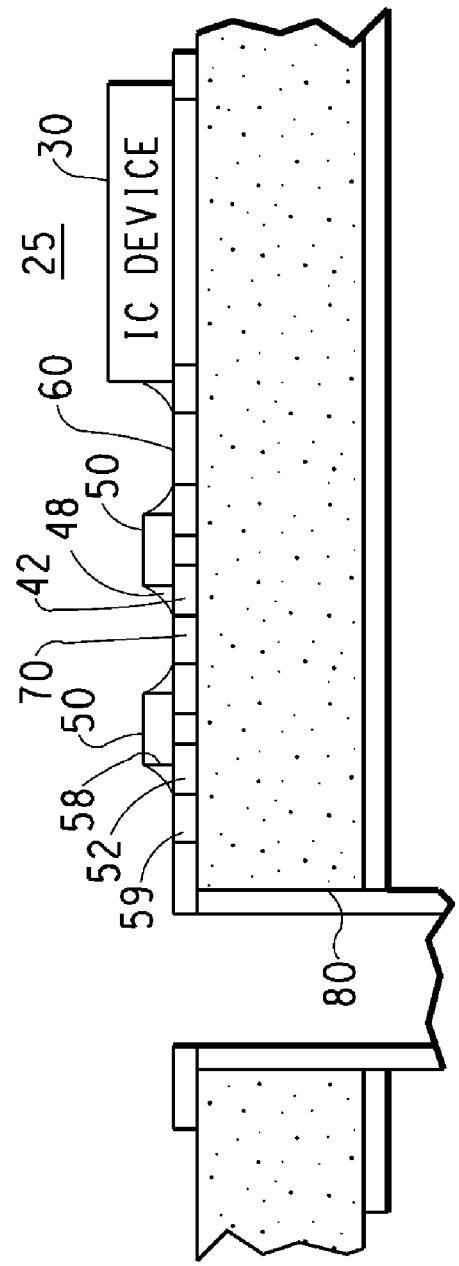
FIG. 1 is a representation in section view in front elevation of a printed wiring board having conventional prior art surface mount technology (SMT) capacitors.

The present invention relates to a dielectric composition comprising: paraelectric filler; and polymer wherein said paraelectric filler has a dielectric constant between 50 and 150. The present invention further relates to the composition above wherein said composition has been processed to form a film and a capacitor comprising the film.

A further embodiment of the present invention is a capacitor comprising the dielectric composition above disposed between two conductive electrodes and a printed wiring board comprising said capacitor. Still a further embodiment of the present invention is a printed circuit comprising said capacitor whereby the outermost two conductive layers and the dielectric layer between said conductive layers form said capacitor on one or both sides of the printed wiring board. Still a further embodiment of the present invention is a printed circuit comprising said capacitor whereby more than one capacitor is formed by the outermost conductive layers and the dielectric layers between said conductive layers on one or both sides of the printed wiring board.

Still a further embodiment relates to a method of forming an embedded planar capacitor comprising: coating the dielectric composition above on a carrier film such as polyester (PET) and transferring said dielectric composition to a circuitized core, such as a power core (as disclosed in U.S Patent Publication No. 2006/0138591A1 herein incorporated by reference) typically, by vacuum lamination, platen press, hot roll, or autoclave lamination.

A multitude of embodiments may make-up the circuitized core which comprises power, ground, and signal embedded passives. One embodiment of the circuitized core is a power core which comprises: at least one embedded singulated capacitor layer containing at least one embedded singulated capacitor; and at least one planar capacitor laminate; wherein said planar capacitor laminate serves as a low inductance path to supply a charge to said at least one embedded singulated capacitor; and wherein said at least one embedded singulated capacitor is connected in parallel to at least one of the said planar capacitor laminates; and wherein said power core is interconnected to at least one signal layer.

A further embodiment relates to a method of forming a planar capacitor comprising: providing the dielectric composition above; applying said dielectric composition to a metallic layer, thus forming a metallic side and a dielectric side and laminating this structure to a printed circuit board with the dielectric composition facing the printed circuit board. Still a further embodiment relates to a method of forming a planar capacitor comprising: providing the dielectric composition above; applying said dielectric composition to a first metallic layer, thus forming a metallic side and a dielectric side; and applying a second metallic layer to said dielectric side; providing a second dielectric layer; laminating the second dielectric layer and the first dielectric layer and its two metal layers to a printed circuit board so that the second dielectric layer is placed between the first dielectric layer and the printed circuit board. Further embodiments are planar capacitors and multilayer structures comprising the capacitors formed by the methods above.

Capacitors constructed utilizing the composition of the present invention generally have high capacitance densities and other desirable electrical and physical properties. The capacitors can be, for example, mounted on printed wiring boards and on integrated circuit substrates, and can be used to form integrated circuit packages and integrated passive devices.

Those skilled in the art will appreciate the above stated advantages and other advantages and benefits of various additional embodiments of the invention upon reading the following detailed description of the embodiments with reference to the below-listed drawings.

According to common practice, the various features of the drawings discussed below are not necessarily drawn to scale. Dimensions of various features and elements in the drawings may be expanded or reduced to more clearly illustrate the embodiments of the invention.

The present invention relates to a dielectric composition and dielectric film which allow for improved electrical performance of printed circuit boards and integrated circuit packages, such as high dielectric withstanding voltage and low leakage current, fast charge delivery to the semiconductor, with minimal delay due to loop inductance, to enable fast signal rise time, and to dampen semiconductor switching noise. The dielectric composition comprises a paraelectric filler, such as, but not limited to, $TiO_2$, $Ta_2O_5$, $HfO_2$, $Nb_2O_5$, $Al_2O_3$, and Steatite and a polymer. The filler could be any paraelectric filler with a dielectric constant between 10 and 150. The paraelectric filler has a relatively high insulation resistance (low leakage current) and breakdown voltage in bulk form.

Paraelectric Filler The paraelectric ceramic filler with a dielectric constant between 10 and 150 and having a high insulation resistance and breakdown voltage is essential to the present invention. Paraelectric ceramic fillers are defined herein to mean ceramic particles that show a linear response of charge or polarization versus voltage. Paraelectric fillers show a total reversible polarization of charges within the crystal structure after the applied electric filed is removed. Traditionally ferroelectric fillers are used to increase the dielectric constant of a dielectric, because they usually have a higher dielectric constant than paraelectric fillers. The higher dielectric constants of ferroelectric materials are caused by the non-linear response of charge and polarization versus voltage. This non-linear response is a key property of ferroelectric materials. Ferroelectric fillers also show a hysteresis affect with polarization by an applied field because of nonreversible changes in the crystal structure. Although the ferroelectric fillers have higher dielectric constants, they have major negative electrical properties because of the ferroelectric properties. Ferroelectric materials tend to have lower insulation resistance (higher leakage current) than paraelectric materials. Ferroelectric materials also tend to have lower dielectric withstanding voltage and wider variation in capacitance with temperature. To achieve high capacitance for a filled polymer film three factors are available: increase the dielectric constant of the filler powder, increase the concentration of the filler powder, or decrease the thickness of the filled polymer film. Ferroelectric fillers certainly have the advantage of higher dielectric constant. However, the higher dielectric withstanding voltage and lower leakage current of the paraelectric fillers allow these capacitor films to be filled at higher concentrations and be included in thinner films and still achieve all the required electronic properties.

Paraelectric filler powders useful in the present invention include but are not limited to, $TiO_2$, $Ta_2O_5$, $HfO_2$, $Nb_2O_5$, $Al_2O_3$, Steatite and mixtures thereof. These paraelectric materials exhibit high breakdown voltages of approximately 1000 volts per mil or greater and volume resistivities of 10E12 ohm-cm or greater in their bulk form. Typically, the paraelectric filler powder has an average particle size ($D_{50}$) of less than 2 microns. In one embodiment, the average particle size is in the range of 0.1 to 0.3 microns. The paraelectric filler powder is present in the composition in approximately 5 to 55 volume percent.

In one embodiment, the paraelectric filler is $TiO_2$, which has a dielectric constant between 50-117. One example of $TiO_2$ useful in the present invention is Ti-Pure® R101 available from E. I. du Pont de Nemours and Company.

Polymer(s)

The polymers are important to the compositions of this invention. One of the most important features of the polymers are their ability to disperse the paraelectric filler(s) and optional other fillers in the composition. Polymers useful in the present invention include epoxies, acrylics, polyurethanes and polyimides. Suitable polyimides for use in the present invention are disclosed in U.S. Pat. No. 5,298,331 to Kanakarajan et al, herein incorporated by reference.

In one embodiment, the insulation resistance and dielectric withstanding voltage of the paraelectric filler/polymer composition of the present invention are greater than $10^{10}$ ohms per $cm^2$, and greater than 250 volts, respectively, where dielectric withstanding voltage is defined as the voltage the dielectric can withstand for at least 30 seconds.

Additional Components

Other components may be added to the composition such as ferroelectric ceramic fillers, solvents, dispersion agents, adhesive agents, as well as other additives known to those skilled in the art.

Ferroelectric ceramic filler may be added to the composition in various amounts to enhance the electrical properties of the film dependant upon the specific application. Typically, these additional ferroelectric ceramic fillers are present in amount 5 to 25 volume present. In most cases the ferroelectric filler would be a lower concentration than the paraelectric filler. Specific examples of ferroelectric ceramic fillers that may be added to the composition include: perovskites of the general formula $ABO_3$, crystalline barium titanate (BT), barium strontium titanate (BST), lead zirconate titanate (PZT), lead lanthanum titanate, lead lanthanum zirconate titanate (PLZT), lead magnesium niobate (PMN), and calcium copper titanate, and mixtures thereof. Fillers may be in powder form. These ferroelectric fillers may be used individually or in combination. It is noted that these ferroelectric fillers do not meet the definition of paraelectric filler of the present invention. In one embodiment a suitable barium titanate filler (obtainable from Tam Ceramics or Fuji Titanium) is added to the composition. Additionally, the ferroelectric fillers may be coated with a dispersion agent to aid in dispersion within the composition. Solvents may be added to the composition to aid in dispersion. The solvent is not important just so long as it is compatible with the polymer and features of the desired composition. Examples of typical solvents include dimethlyacetamide and N-methylpyrrolidone, aliphatic alcohols, such as isopropanol, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents.

Film Formation

The composition of the present invention may be made into a "film" by supplying the paraelectric filler(s) and optionally, other additive filler(s), mixing the fillers with the desirable polymer, and casting the composition into the shape of a film by techniques known to those in the art, such as conventional die casting techniques. The film may be formed as a single layer or multilayer construction. The film may be formed on a carrier film such as polyester (PET) from which it is transferred to a printed circuit board. Or the film may be formed on a metallic carrier film such as a copper foil, which remains with the dielectric film as it is laminated to the printed circuit board. The film may also be formed on a copper foil that remains with the dielectric film as it is laminated to the printed circuit board, but is subsequently partially or completely removed in a chemical etching step. Also, the film may be formed as a "free-standing" film whereby the dielectric composition is coated into a flat surface from which it is released prior to lamination to a printed circuit board. The film may be formed in various embodiments, including both roll and sheet forms.

As a means of forming a multilayer construction, various methods known to those in the art may be utilized including: extrusion-lamination; thermal compression; solution coating, and coextrusion. These are typical, but not exclusive examples of the methods available for forming a multilayer film.

Formation of Electrical Component Utilizing the Composition/Film of the Present Invention The film of the present invention may be utilized in the formation of various electronic components, such as a capacitor, for example a planar capacitor laminate, formed from one or more layers of the dielectric composition of the present invention.

One particular utility for the composition(s) and film(s) is in dielectric composition(s) of the kind described in U.S. Pat. No. 6,600,645 for forming capacitors, filters and the like. Thus, in one embodiment, the invention is directed to a dielectric composition comprising a polymeric matrix having the paraelectric filler of the instant invention dispersed therein. In another embodiment, the invention is directed to an electrical capacitor comprising a dielectric composition disposed between two conductive electrodes wherein the dielectric composition comprises a polymeric matrix having the paraelectric filler of the instant invention dispersed therein. In still another embodiment, the invention is directed to a pre-fired ceramic dielectric for polymer thick-film capacitors comprising a polymer matrix having the particles of the instant invention dispersed therein. The use of the dielectric composition and film of the present invention may be incorporated into the formation of various aspects of electronic circuitry and electronic components, however it's use in the formation of a planar capacitor laminate is described herein to represent one embodiment of the present invention.

The planar capacitor laminate may be formed from materials that may include metal foil-dielectric-metal foil laminate structures wherein the dielectric comprises one or more layers of the dielectric film of the present invention. Where multiple layers are used, layers may be of different materials. Such dielectrics would be manufactured with thin layers for impedance control.

Figure 2:
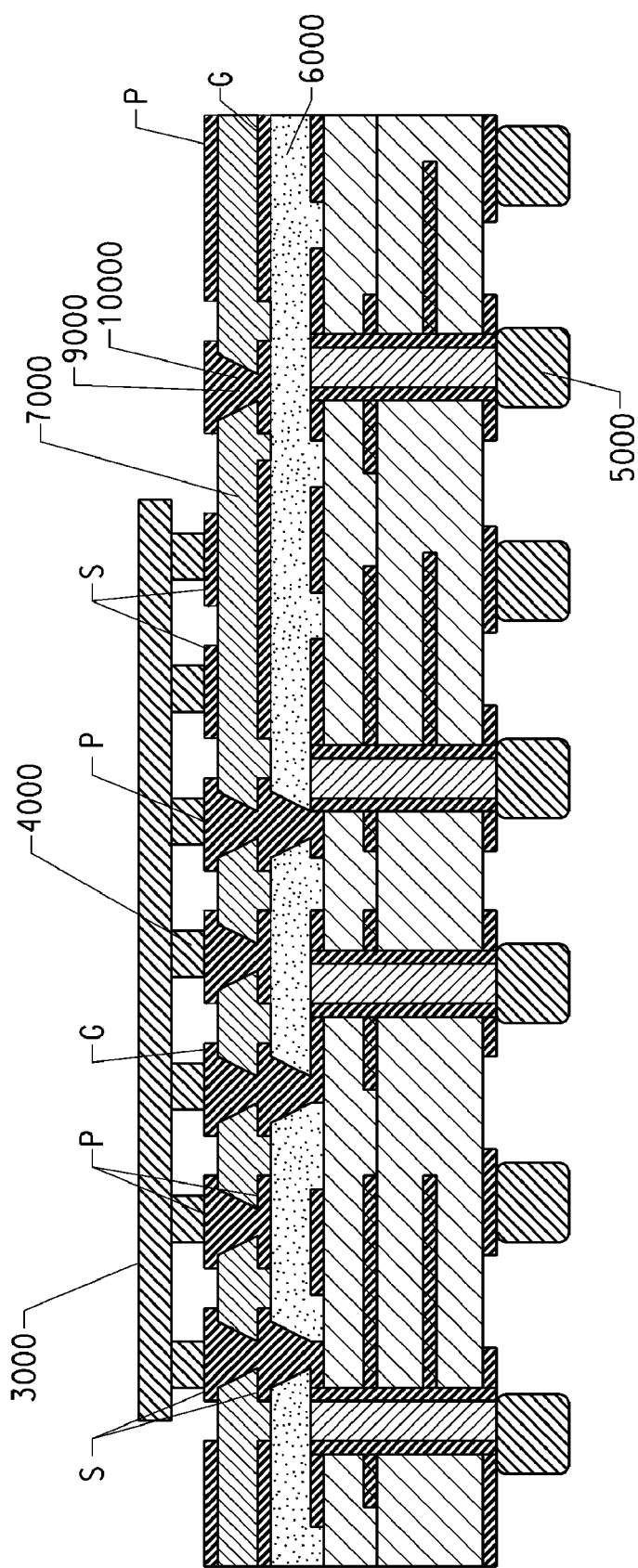
FIG. 2 is a section view of a portion of a printed wiring board having an embedded capacitive device according to one embodiment of the present invention.

FIG. 2 is a representation of one embodiment of the present invention in section view in front elevation of an electronic package wherein "build-up" layers of dielectric film 7000 and 6000 have been applied (typically laminated) to the core. One or more of these build-up layers may comprise the dielectric composition or dielectric films of the present invention. Build-up layers may be arranged symmetrically or asymmetrically around the power core. The build-up layers may be applied (laminated) as a dielectric film, a liquid (curtain-coated), or a resin coated on a metallic layer (for example copper foil), or as a reinforced prepreg, for example B-stage resin. The reinforcement may be woven or non-woven, inorganic (for example glass) or organic (for example aramid fiber).

FIG. 2 is a representation of a structure with "build-up" layers that contain metallized microvia (blind via) connections and circuits on the surface of the build-up layer. The microvias (9000) can be formed by laser drilling, by photo-lithography, or by controlled-depth mechanical drilling. Initial metallization of the build-up layer surface and microvia hole-walls is achieved by depositing a metal seed layer, for example electroless copper. The seed layer deposition may be activated by catalyst deposited on the surface, for example in one embodiment, palladium, or a catalyst or metal precursor dispersed throughout the build-up layer. Alternatively, the build-up layer may be capped by a metallic layer (copper foil), onto which the metal seed layer is deposited after microvia drilling.

FIG. 2 is also a representation in section view in front elevation of an electronic package structure (multilayer structure) comprising patterned conductors on the surface of the build-up layer. Starting with a contiguous metal cover over the build-up layer, conductor patterning can be done with a semi-additive process (SAP), or a "tent & etch" process, or by pattern plating, or by a modified panel plate/tent & etch process. FIG. 2 shows the patterned conductors (S, P, & G) on the surfaces of two build-up layers.

Microvias (9000) may be filled with plated copper (10000; note: all microvias in FIG. 2 are filled with copper; unfilled microvias will have copper only on the microvia sidewalls and bottom) during the electroplating process ("plating shut"), filled with a conductive ink or paste, filled with a non-conductive material, or left unfilled to be filled by a second dielectric build-up layer to be applied on top of the first one.

Examples of vertical interconnects (via-fill, printed, etched, plated bumps) where layers are built individually and then laminated in one step may be utilized in the present invention. The combination of buried planar capacitors and buried discrete capacitors is also applicable to so called "coreless/stacked via packages". One such example is the Any Layer Interstitial Via Hole (ALIVH) process (available through Matsushita). The ALIVH process may also incorporate planar and discrete capacitors. Another such stacked via process is the $B^2$it process® (available through Toshiba Corporation) where planar and discrete capacitors can be incorporated in similar fashion. Other examples include the Neo Manhattan Bump Interconnection (NMBI) (North Corp.), and patterned prepreg lay-up process (PALAP)(Denso Corp.).

FIG. 2 is a representation in section view in front elevation of a power core structure comprising patterned conductors on the surface of the build-up layer and subsequent build-up layers which have been formed, metallized, and patterned in a similar fashion. FIG. 2 further illustrates that a planar capacitance layer (7000) may be incorporated into the build-up dielectric. Microvias may be stacked relative to the position of underlying microvias or they may be staggered. Stacked vias need to be metal-filled. The package may then be connected to the bumps of (4000) a flip chip (3000) in a high temperature soldering step, and connected to a mother board via solder joints (5000) in a lower temperature soldering step. It is understood that conductive, typically copper, features form contiguous connections to the solder joints through conductors in the Y-axis and vias in the Z-axis.

It is further understood by those skilled in the art, that multiple build-up dielectric layers may be formed sequentially wherein each buildup layer comprises applicable conductive pattern and through hole connections on each dielectric layer and conductive through hole connections, thus forming an entire electronic package.

Those skilled in the art will appreciate the above stated advantages and other advantages and benefits of various embodiments of the invention upon reading this detailed description of the embodiments with reference to the below-listed drawings.

According to common practice, the various features of the drawings are not necessarily drawn to scale. Dimensions of various features may be expanded or reduced to more clearly illustrate the embodiments of the invention.

The foregoing description of the invention illustrates and describes one embodiment of the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described herein above are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

EXAMPLES

Preparation of $TiO_2$-filled Dielectric Film

First, 30 g of DuPont Ti-Pure® R-101 titanium dioxide powder were dispersed in a high shear mixer into a solution of DriClad® epoxy-based resin in MEK (methyle ethyle ketone) solvent (source: EIT-Endicott Interconnect Technologies). The weight of the solution was 211 g containing 160 g resin (75.8% solids). 2-methylimidazole (0.208 g) was dissolved in 90 g MEK and added to the dispersion (imidazole to resin weight ratio of 0.13/100). The resulting dispersion had a viscosity of 19 cps and a 55.83% solids content. The dispersion was then board-coated on an about 25 micron thick Mylar® foil using a 150 micron board coating blade. The dried coating thickness was approximately 40 micron; the coating width was about 18 cm, and the coating length was about 137 cm. The coating was dried with a hot air blower. The coating was then covered with a silicone-release Mylar® foil so that the rolled up coated foil would not stick to itself. The coated foil was then rolled up on a 7.5 cm diameter plastic core.

Lamination of the $TiO_2$-filled Film onto a Patterned Substrate

The film was laminated to circuitized test vehicle using a Meiki vacuum laminator. The polyester release sheet was first removed. Then the film was laminated to the test vehicle with the $TiO_2$-filled coating facing the circuitized test pattern. The Mylar® cover, onto which the resin had been coated, remained on top of the film during lamination. Lamination conditions: 120° C., 3 minutes, 145 psi. The Mylar® cover was then removed and the $TiO_2$-filled film was cured in a hot air oven at 195° C. for 2 hours.

Test Vehicle Preparation:

Copper-clad laminate (standard epoxy/glass FR-4 dielectric) was patterned using standard printed wiring board processing: dry film resist lamination to the copper-clad laminate on a hot roll laminator (HRL), exposure in a UV imager using a silver halide phototool with the negative image of the test pattern, aqueous development, acid etch, resist strip. The copper thickness was ½ ounce (about 17 micron). The copper traces were about 50 micron wide. The spaces between the copper traces were about 65 micron wide.

Lamination Results:

SEMs of cross-sections of the laminated film on the patterned substrate showed the 40 micron thick $TiO_2$-filled film encapsulating the copper features completely. The surface of the laminated film was near planar.

Example #1

A solution of 160 grams of a polyamic acid derived from the following monomers: pyromellitic dianhydride (PMDA), 4,4'-oxydiphthalic anydride (ODPA) and 1,3-bis-(4-aminophenoxy) benzene (APB-134) was mixed with 120 grams of Dimethylacetamide (DMAC) solvent and 30 grams of DuPont Ti-Pure® R-101 titanium dioxide powder. This solution was stirred in a high speed mixer until the powder was dispersed. Small amounts of additional monomer were added until a viscosity of 500 poise was reached. This solution was then coated on solid surface as a uniform coating. The coating was then dried at 170° C. to remove about 70 to 80% of the solvent. The formed film was then removed from the solid surface. This film was then cured in an oven at 350° C. for 1 hour. The final film thickness was 1.1 mils and the filler loading was 26 volume percent.

The cured titanium dioxide filled film was then laminated between two sheets of copper foil. Each copper sheet was 36 microns thick. The lamination press cycle started by holding sheets at 250° C. for 1.5 hours under vacuum. A pressure of 10 psi was applied to the sheets for the last ½ hour. The temperature was then raised to 350° C. for an additional 1 hour. After 30 minutes at the higher temperature, the pressure was increased to 352 psi. The heat was then turned off and after cooling the samples were removed.

Using photoresist imaging and copper etching, 1 inch diameter capacitors were imaged for testing. Electrical testing of the imaged capacitors showed that they could pass 500 volts DC in the dielectric withstanding voltage test. At 3 volts the resistance across the dielectric was greater than $10^{10}$ ohms per cm$^2$. The leakage current at 100 volts DC was less than 0.1 microamp per cm$^2$. A similar sample filled with barium titanate, a ferroelectric filler, had resistance at 3 volts of $4 \times 10^8$ ohms per cm$^2$, would pass only 100 volts DC in the dielectric withstanding voltage test, and would have leakage current at 100 volts DC of over 100 microamps per cm$^2$.

Example #2

A solution of 18 lbs of DMAC and 18 lbs of DuPont Ti-Pure® R-101 titanium dioxide powder was stirred for 1 hour in a high speed mixer. Then 84 lbs of a polyamic acid derived from the following monomers: pyromellitic dianhydride (PMDA), 4,4'-oxydiphthalic anydride (ODPA) and 1,3-bis-(4-aminophenoxy) benzene (APB-134) was added. This mixture was stirred for an additional 30 minutes. Small amounts of additional monomer were added until a viscosity of 400 poise was reached.

This solution was then cast on to a continued sheet of copper foil (36 microns thick). The solution was dried at 190° C. to about 90% solids. The coated copper was then cured in an oven at 350° C. for 1 hour. The final film thicknesses were 8 and 12 microns. The filler loading was 29 volume percent.

The filled polyimide film coated on copper was then laminated to a sheet of copper foil. The copper sheet was 35 microns thick. The lamination used an autoclave under vacuum with maximum lamination temperature of 350° C.

Using photoresist imaging and copper etching, 1 inch diameter capacitors were imaged for testing. Electrical testing of the imaged capacitors showed that they could pass 250 volts DC in the dielectric withstanding voltage test for the 8 micron thick dielectric sample. At 3 volts the resistance across the dielectric was greater than $10^{10}$ ohms per cm$^2$. The leakage current at 100 volts DC was less than 0.1 microamp per cm$^2$.

What is claimed is:

1. A method of forming a multilayer structure comprising:
providing a dielectric composition comprising paraelectric filler and polymer wherein said paraelectric filler has a dielectric constant between 50 and 150;
applying said dielectric composition to a carrier film thus forming a multilayer film comprising a dielectric layer and carrier film layer;
laminating said multilayer film to a circuitized core wherein the dielectric layer of said multilayer film is facing said circuitized core; and
removing said carrier film layer from said dielectric layer prior to processing;
applying a metallic layer to said dielectric layer wherein said circuitized core, dielectric layer and metallic layer form a planar capacitor; and
processing said planar capacitor to form a multilayer structure.

2. A method of forming a multilayer structure comprising:
providing a dielectric composition comprising paraelectric filler and polymer wherein said paraelectric filler has a dielectric constant between 50and 150;
applying said dielectric composition to a metallic carrier film thus forming a multilayer film comprising a dielectric layer and carrier film layer;
laminating said multilayer film to a circuitized core wherein the dielectric layer of said multilayer film is facing said circuitized core and wherein said circuitized core, dielectric layer and carrier film layer form a planar capacitor; and
processing said planar capacitor to form a multilayer structure.

3. The method of any one of claims 1 or 2 further comprising providing a release film layer and applying said release film layer to said dielectric layer and removing said release layer prior to laminating.

4. The method of any one of claims 1 or 2 wherein said paraelectric filler is present in an amount of 5 to 55 volume percent.

5. The method of any one of claims 1 or 2 wherein said dielectric composition further comprises a solvent.

6. The method of any one of claims 1 or 2 wherein said paraelectric filler is selected from the group consisting of $TiO_2$, $Ta_2O_5$, $Hf_2O_5$, $Nb_2O_5$, $Al_2O_3$, Steatite and mixtures thereof.

7. The method of any one of claims 1 or 2 wherein said paraelectric filler has an average particle size of less than 2 microns.

8. The method of any one of claims 1 or 2 wherein said polymer is selected from an epoxy, acrylic, polyurethane and polyimide.

9. The method of any one of claims 1 or 2 wherein said dielectric composition further comprises a ferroelectric filler.

10. The method of claim 9 wherein said ferroelectric filler is selected from the group consisting of perovskites of the general formula $ABO_3$, crystalline barium titanate (BT), barium strontium titanate (BST), lead zirconate titanate (PZT), lead lanthanum titanate, lead lanthanum zirconate titanate (PLZT), lead magnesium niobate (PMN), calcium copper titanate and mixtures thereof.

* * * * *

UNITED STATES PATENT AND TRADEMARK OFFICE
CERTIFICATE OF CORRECTION

PATENT NO. : 7,621,041 B2  Page 1 of 1
APPLICATION NO. : 11/451763
DATED : November 24, 2009
INVENTOR(S) : Banerji et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 564 days.

Signed and Sealed this

Twenty-sixth Day of October, 2010

David J. Kappos
*Director of the United States Patent and Trademark Office*